United States Patent
Jin et al.

(10) Patent No.: US 6,863,593 B1
(45) Date of Patent: Mar. 8, 2005

(54) CHEMICAL MECHANICAL POLISHING A SUBSTRATE HAVING A FILLER LAYER AND A STOP LAYER

(75) Inventors: Raymond R. Jin, San Jose, CA (US); Shijian Li, San Jose, CA (US); Fred C. Redeker, Fremont, CA (US); Thomas H. Osterheld, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 869 days.

(21) Appl. No.: 09/184,805

(22) Filed: Nov. 2, 1998

(51) Int. Cl.$^7$ .............................................. B24C 1/08
(52) U.S. Cl. ............................................. 451/37; 451/41
(58) Field of Search .................... 451/41, 287, 288, 451/36, 37, 60

(56) References Cited

U.S. PATENT DOCUMENTS

| | | | | |
|---|---|---|---|---|
| 5,114,875 A | * | 5/1992 | Baker et al. ................... 437/62 |
| 5,142,828 A | | 9/1992 | Curry, II ....................... 51/281 |
| 5,302,551 A | | 4/1994 | Iranmanesh et al. ........ 437/195 |
| 5,340,370 A | * | 8/1994 | Cadien et al. ................. 51/308 |
| 5,395,801 A | * | 3/1995 | Doan et al. ................... 437/225 |
| 5,516,346 A | * | 5/1996 | Cadien et al. ................. 51/308 |
| 5,527,423 A | * | 6/1996 | Neville et al. ............ 156/636.1 |
| 5,576,241 A | * | 11/1996 | Sakai ............................ 437/63 |
| 5,597,341 A | | 1/1997 | Kodera et al. .................. 451/5 |
| 5,656,554 A | | 8/1997 | Desai et al. ................. 438/691 |
| 5,676,587 A | * | 10/1997 | Landers et al. ................ 451/57 |
| 5,700,383 A | * | 12/1997 | Feller et al. ................... 216/88 |
| 5,836,806 A | * | 11/1998 | Cadien et al. ................ 451/41 |
| 5,913,712 A | * | 6/1999 | Molinar ....................... 451/41 |
| 5,916,855 A | * | 6/1999 | Avanzino et al. .............. 51/307 |
| 5,923,993 A | * | 7/1999 | Sahota et al. ................ 438/427 |
| 5,934,980 A | * | 8/1999 | Koos et al. .................... 451/41 |
| 5,938,505 A | * | 8/1999 | Morrison et al. .............. 451/36 |
| 5,954,975 A | * | 9/1999 | Cadien et al. ................ 216/38 |
| 5,960,317 A | * | 9/1999 | Jeong .......................... 438/633 |

FOREIGN PATENT DOCUMENTS

| | | |
|---|---|---|
| EP | 0 504 984 A2 | 9/1992 |
| EP | 0 568 475 A1 | 11/1993 |
| EP | 0 663 265 A1 | 7/1995 |
| EP | 0 774 323 A3 | 5/1996 |
| WO | WO 98/44061 | 10/1998 |

* cited by examiner

Primary Examiner—Allen Ostrager
Assistant Examiner—J Nguyen
(74) Attorney, Agent, or Firm—Fish & Richardson

(57) ABSTRACT

A substrate is chemical mechanical polished with a high-selectivity slurry until the stop layer is at least partially exposed, and then the substrate is polished with a low-selectivity slurry until the stop layer is completely exposed.

22 Claims, 5 Drawing Sheets

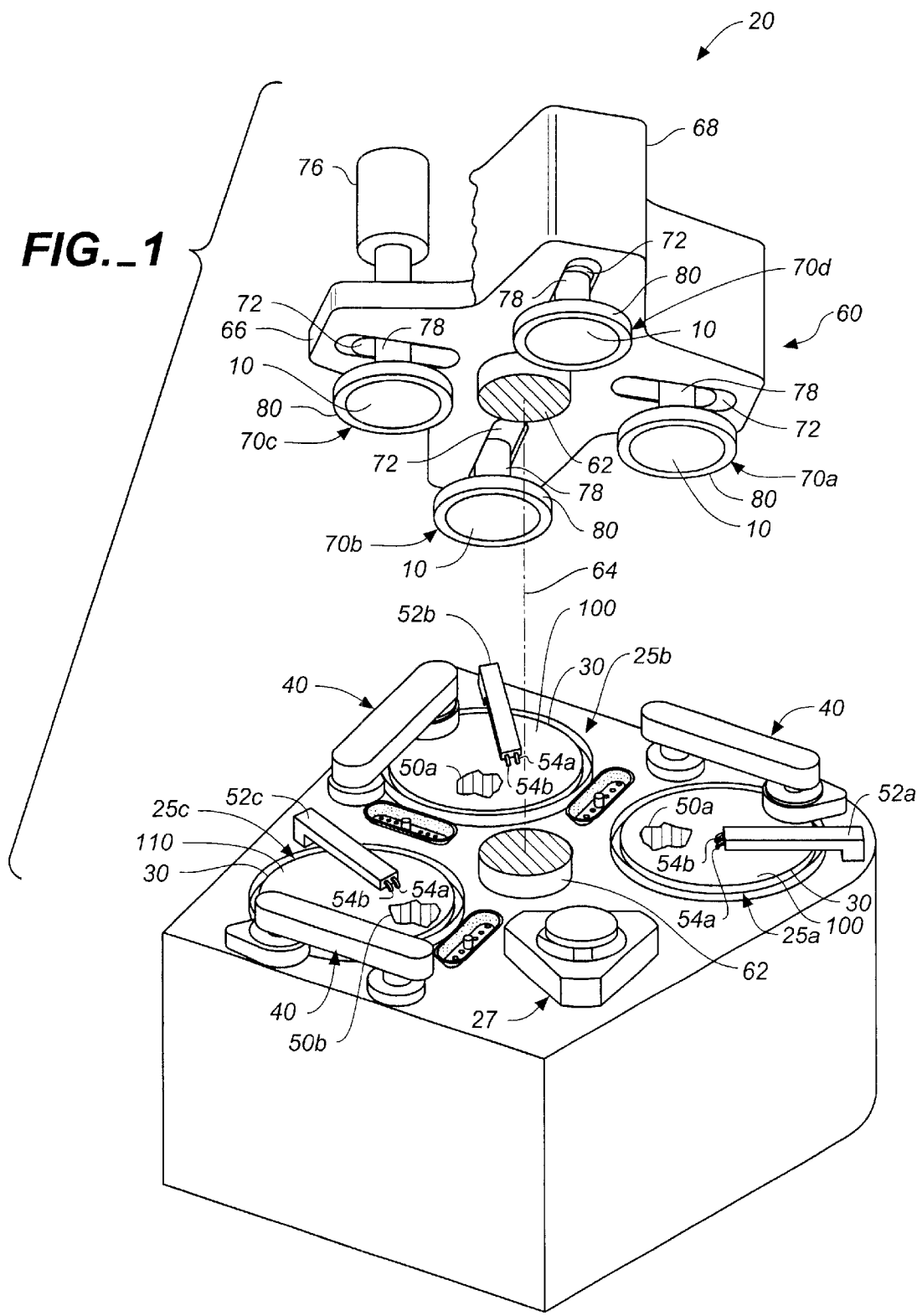
FIG._1

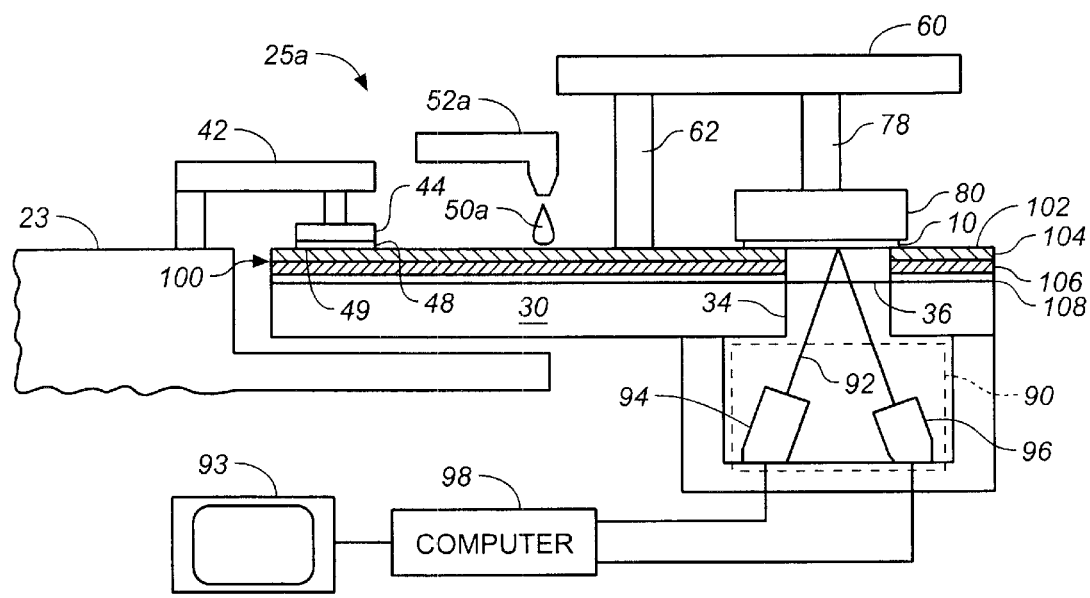
FIG._2A
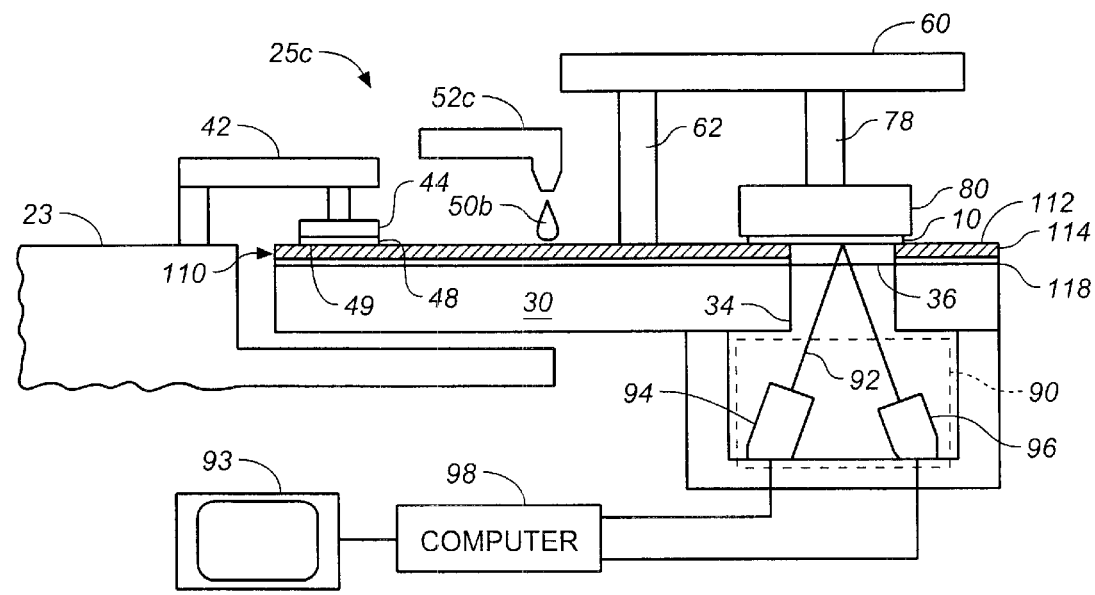
FIG._2B

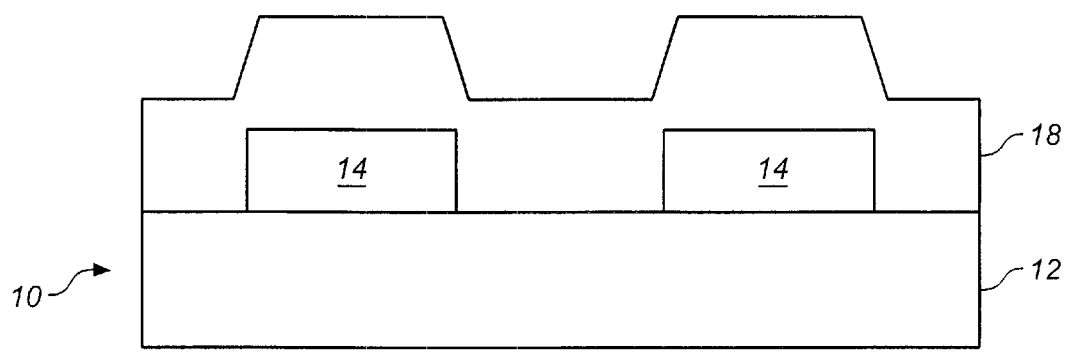
FIG._3A
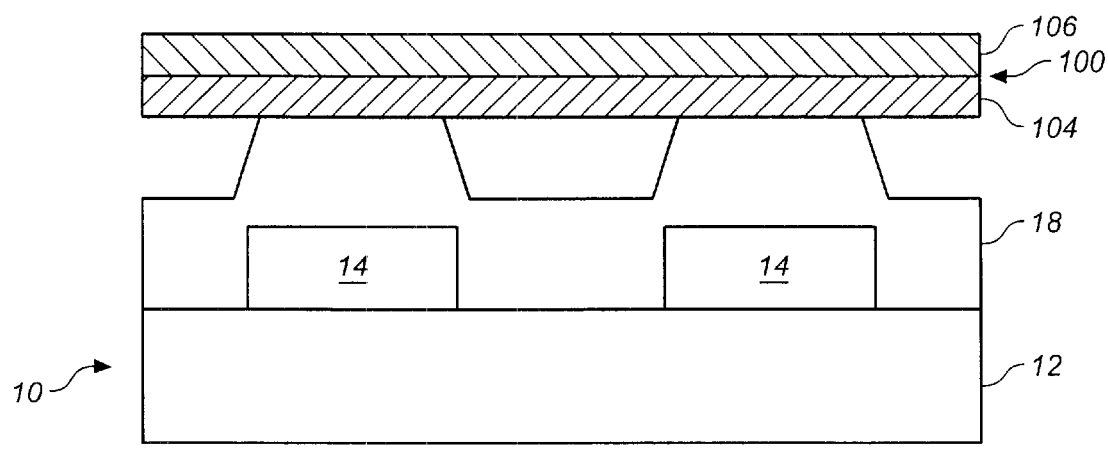
FIG._3B
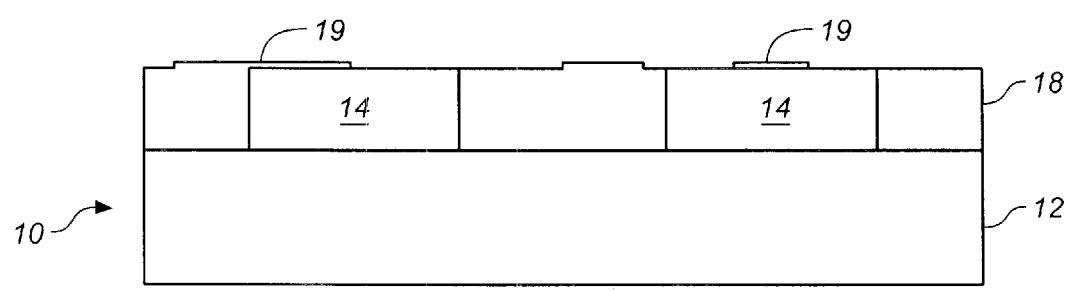
FIG._3C

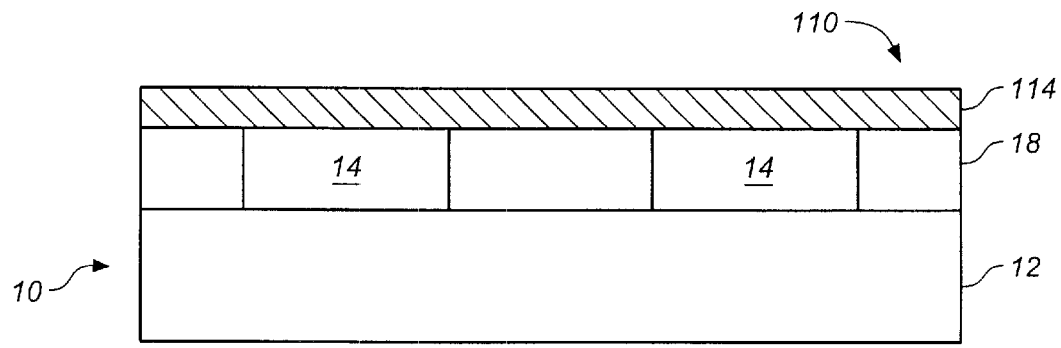
FIG._3D
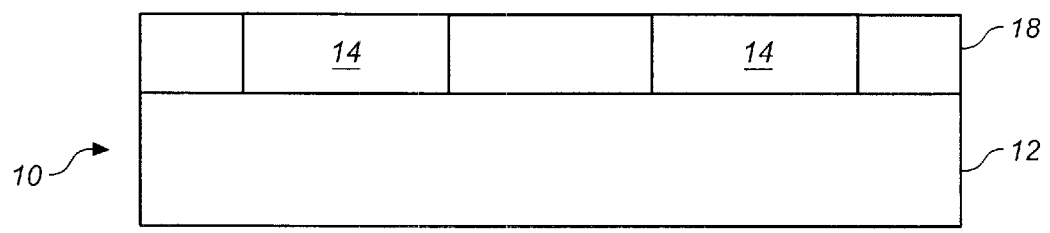
FIG._3E
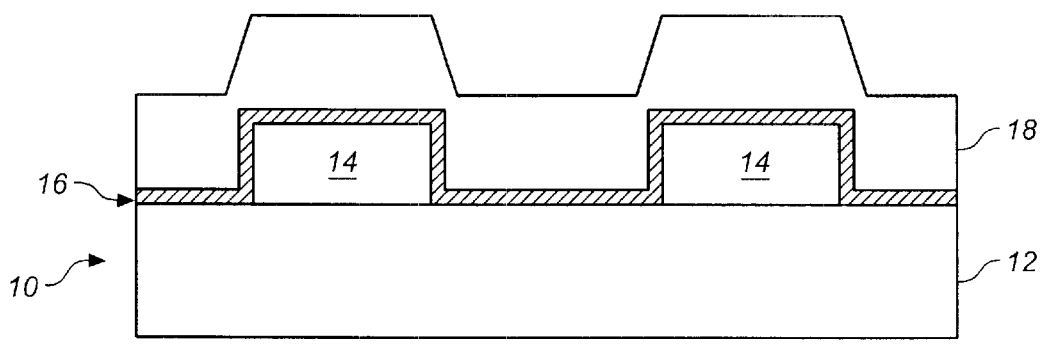
FIG._4A

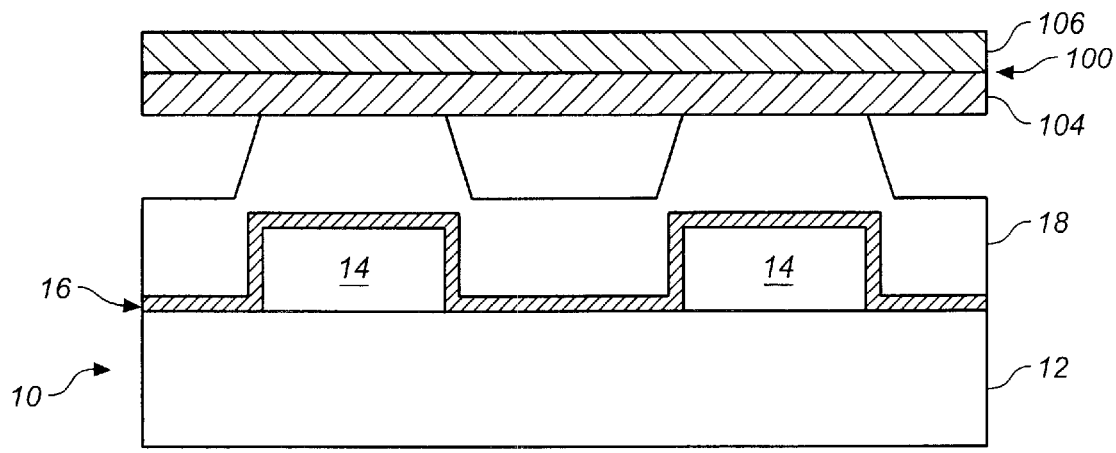
FIG._4B
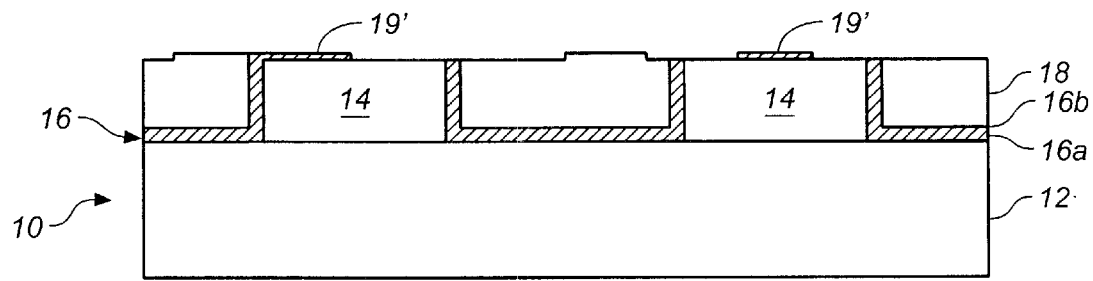
FIG._4C
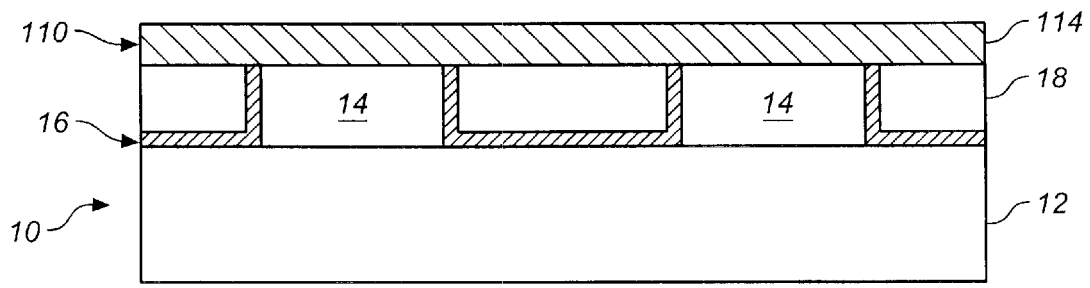
FIG._4D
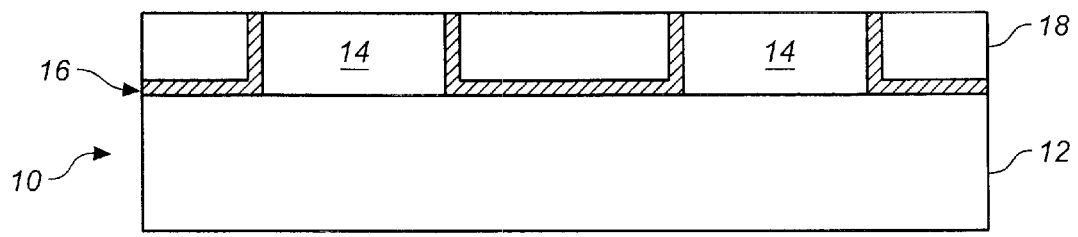
FIG._4E

CHEMICAL MECHANICAL POLISHING A SUBSTRATE HAVING A FILLER LAYER AND A STOP LAYER

BACKGROUND

The present invention relates generally to chemical mechanical polishing of substrates, and more particularly to chemical mechanical polishing a substrate having a filler layer and a stop layer.

An integrated circuit is typically formed on a substrate by the sequential deposition of conductive, semiconductive or insulative layers on a silicon wafer. One fabrication step involves depositing a filler layer over a patterned stop layer, and planarizing the filler layer until the stop layer is exposed. For example, a conductive filler layer may be deposited on a a patterned insulative stop layer to fill the trenches or holes in the stop layer. After planarization, the portions of the conductive layer remaining between the raised pattern of the insulative layer form vias, plugs and lines that provide conductive paths between thin film circuits on the substrate.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished (lacks small-scale roughness) and flat (lacks large-scale topography). The polishing rate, finish and flatness are determined by the pad and slurry combination, the relative speed between the substrate and pad, and the force pressing the substrate against the pad. The polishing rate sets the time needed to polish a layer. Because inadequate flatness and finish can create defective substrates, the selection of a polishing pad and slurry combination is usually dictated by the required finish and flatness. Given these constraints, the polishing time needed to achieve the required finish and flatness sets the maximum throughput of the CMP apparatus.

A reoccurring problem in CMP is so-called "dishing" in the substrate surface. Specifically, when the stop layer is exposed, the portion of the filler layer between the raised areas of the patterned stop layer can be overpolished, creating concave depressions in the substrate surface. Dishing can render the substrate unsuitable for integrated circuit fabrication, lowering process yield.

SUMMARY

In general, in one aspect, the invention features a method of chemical mechanical polishing a substrate having a filler layer disposed on a stop layer. The substrate is polished with a first slurry until the stop layer is at least partially exposed, and then the substrate is polished with a second slurry which has a lower selectivity than the first slurry until the stop layer is substantially completely exposed.

Implementation of the invention may include one or more of the following features. The first slurry may have a selectivity greater than about 20:1, e.g. a selectivity of approximately 100:1. The second slurry may have a selectivity less than about 6:1, e.g. a selectivity of approximately 1:1. The stop layer may be a first dielectric material, such as nitride and the filler layer may be a second dielectric material, such as oxide. The stop layer may be an insulation, such as oxide, and the filler layer may be a conductor such as a metal. The filler layer may be a silicon layer, such as the radial position may be determined from a head sweep profile and the filler layer may be an insulative layer.

The second polishing step may overpolish or buff the substrate. A barrier layer may be disposed between the filler layer and the stop layer, and the second polishing step may remove at least a portion of the barrier layer to ensure that the stop layer is substantially exposed. The first and second polishing steps may be conducted with first and second polishing pads, respectively, and the first polishing pad may be harder than the second polishing pad. The first polishing step may include polishing at a plurality of polishing stations. The second polishing step may include polishing at a single polishing station, or the first and second polishing steps may occur at a single polishing station.

In another aspect, the invention is directed to a method of chemical mechanical polishing a substrate having a filler layer disposed on a stop layer. The substrate is polished with a first slurry until an endpoint detector determines that the stop layer is at least partially exposed. There over the substrate is polished with a second slurry which has a lower selectivity than the first slurry to ensure that the stop layer is substantially completely exposed.

In another aspect, the invention is directed to a method of filling a trench in a stop layer on a substrate. A filler layer is deposited over the stop layer. The substrate is polished with a first polishing pad and a first slurry until the stop layer is at least partially exposed. The substrate is polished with a second polishing pad and a second slurry which has a lower selectivity than the first slurry until a top surface of the stop layer is substantially completely exposed.

Advantages of the invention may include the following. Dishing in the substrate surface is reduced or eliminated, thereby increasing process yield. A thinner filler layer can be used, thereby decreasing the polishing time and increasing the throughput of the CMP apparatus. The substrate can be buffed for a longer period of time, thereby improving the substrate finish.

Other features and advantages will be apparent from the following description, including the drawings and claims.

BRIEF DESCRIPTION OF THE DRAWINGS

FIG. 1 is a schematic exploded perspective view of a chemical mechanical polishing apparatus.

FIG. 2A is a schematic cross-sectional view of the first polishing station of the CMP apparatus of FIG. 1.

FIG. 2B is a schematic cross-sectional view of the final polishing station of the CMP apparatus of FIG. 1.

FIGS. 3A–3E are schematic cross-sectional views of a substrate illustrating the method of the present invention.

FIGS. 4A–4E are schematic cross-sectional views of a substrate having a barrier layer illustrating the method of the present invention.

DETAILED DESCRIPTION

Referring to FIG. 1, one or more substrates 10 will be polished by a chemical mechanical polishing (CMP) apparatus 20. A description of a similar polishing apparatus 20 may be found in U.S. Pat. No. 5,738,574, the entire disclosure of which is incorporated herein by reference. Polishing apparatus 20 includes a series of polishing stations, including a first polishing station 25a, a second polishing station 25b, and a final polishing station 25c, and a transfer station 27. Transfer station 27 serves multiple functions, including receiving individual substrates 10 from a loading apparatus (not shown), washing the substrates, loading the substrates into carrier heads, receiving the substrates from the carrier heads, washing the substrates again, and finally, transferring the substrates back to the loading apparatus.

Each polishing station includes a rotatable platen 30 on which is placed a polishing pad. The first and second stations 25a and 25b may include a relatively hard polishing pad 100, whereas the final polishing station may include a relative soft polishing pad 110. If substrate 10 is a "six-inch" (150 millimeter) or "eight-inch" (200 millimeter) diameter disk, then the platens and polishing pads may be about twenty inches in diameter. If substrate 10 is a "twelve-inch" (300 millimeter) diameter disk, then the platens and polishing pads may be about thirty inches in diameter. Each platen 30 may be a rotatable aluminum or stainless steel plate connected to a platen drive motor (not shown). For most polishing processes, the platen drive motor rotates platen 30 at thirty to two hundred revolutions per minute, although lower or higher rotational speeds may be used.

Each polishing station 25a, 25b and 25c also includes a combined slurry/rinse arm 52a, 52b and 52c, respectively, that projects over the associated polishing pad surface. Each slurry/rinse arm 52a–52c may include two or more slurry supply tubes 54a and 54b connected to a slurry delivery system to provide two or more slurries to the surface of the polishing pad. In operation, combined slurry/rinse arms 52a and 52b may supply a first polishing slurry 50a to polishing stations 25a and 25b, whereas combined slurry/rinse arm 52c may supply a second polishing slurry 50b to final polishing station 25c. Typically, sufficient slurry is provided to cover and wet the entire polishing pad. Each slurry/rinse arm 52a–52c also includes several spray nozzles (not shown) which provide a high-pressure rinse of the polishing pad at the end of each polishing and conditioning cycle. Each polishing station 25a–25c may further include an associated pad conditioner apparatus 40.

A rotatable multi-head carousel 60 is supported above the polishing stations by a center post 62 and is rotated thereon about a carousel axis 64 by a carousel motor assembly (not shown). Carousel 60 includes four carrier head systems 70a, 70b, 70c, and 70d mounted on a carousel support plate 66 at equal angular intervals about carousel axis 64. Three of the carrier head systems receive and hold substrates, and polish them by pressing them against the polishing pads on the platens of polishing stations 25a–25c. One of the carrier head systems receives a substrate from and delivers a substrate to transfer station 27.

Each carrier head system 70a–70d includes a carrier or carrier head 80. A carrier drive shaft 78 connects a carrier head rotation motor 76 (shown by the removal of one quarter of a carousel cover 68) to carrier head 80 so that each carrier head 80 can independently rotate about its own axis. In addition, each carrier head 80 independently laterally oscillates in a radial slot 72 formed in carousel support plate 66.

The carrier head 80 performs several functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

The carrier head 80 may include a flexible membrane (not shown) which provides a substrate receiving surface. A description of a suitable carrier head 80 may be found in U.S. patent application Ser. No. 08/745,679, entitled a CARRIER HEAD WITH a FLEXIBLE MEMBRANE FOR a CHEMICAL MECHANICAL POLISHING SYSTEM, filed Nov. 8, 1996, by Steven M. Zuniga et al., assigned to the assignee of the present invention, the entire disclosure of which is incorporated herein by reference.

Referring to FIG. 2A, an aperture or hole 34 is formed in each platen 30 and a transparent window 36 is formed in a portion of polishing pad 100 overlying the hole. The transparent window 36 may be constructed as described in U.S. patent application Ser. No. 08/689,930, entitled METHOD OF FORMING a TRANSPARENT WINDOW IN a POLISHING PAD FOR a CHEMICAL MECHANICAL POLISHING APPARATUS by Manoocher Birang, et al., filed Aug. 26, 1996, and assigned to the assignee of the present invention, the entire disclosure of which is incorporated herein by reference. The hole 34 and transparent window 36 are positioned such that they have a "view" of substrate 10 during a portion of the platen's rotation, regardless of the translational position of the polishing head. A laser interferometer 90 is located below platen 30. The laser interferometer includes a laser 94 and a detector 96. The laser generates a collimated laser beam 92 which propagates through transparent window 36 to impinge upon the exposed surface of substrate 10.

In operation, CMP apparatus 20 uses laser interferometer 90 to determine the amount of material removed from the surface of the substrate, or to determine when the surface has become planarized. A general purpose programmable digital computer 98 may be connected to laser 94 and detector 96. Computer 98 may be programmed to activate the laser when the substrate overlies the window, to store measurements from the detector, to display the measurements on an output device 93, and to detect the polishing endpoint, as described in aforementioned U.S. patent application Ser. No. 08/689,930.

Still referring to FIG. 2A, at first and second polishing stations 25a and 25b, the platen may support a polishing pad 100 having a roughed surface 102, an upper layer 104 and a lower layer 106. Lower layer 106 may be attached to platen 30 by a pressure-sensitive adhesive layer 108. Upper layer 104 may be harder than lower layer 106. For example, upper layer 104 may be composed of microporous polyurethane or polyurethane mixed with a filler, whereas lower layer 106 may be composed of compressed felt fibers leached with urethane. A two-layer polishing pad, with the upper layer composed of IC-1000 or IC-1400 and the lower layer composed of SUBA-4, is available from Rodel, Inc. of Newark, Del. (IC-1000, IC-1400 and SUBA-4 are product names of Rodel, Inc.).

Referring to FIG. 2B, at final polishing station 25c, the platen may support a polishing pad 110 made of a single soft layer 114 and including a generally smooth surface 112. Layer 114 may be attached to platen 30 by a pressure-sensitive adhesive layer 118. Layer 114 may be composed of a napped poromeric synthetic material. A suitable soft polishing pad is available from Rodel, Inc., under the trade name Politex. Polishing pad 110 may be embossed or stamped with a pattern to improve distribution of slurry across the face of the substrate. Polishing station 25c may otherwise be identical to polishing stations 25a and 25b.

FIGS. 3A–3E illustrate the process of chemical-mechanically polishing a filler layer. As shown in FIG. 3A, substrate 10 includes a polishing stop layer 14 disposed over a silicon wafer 12. The polishing stop layer 14 is either patterned or disposed on a patterned underlying layer or layers so that it has a non-planar outer surface. A filler layer 18 is disposed over stop layer 14. The outer surface of filler layer 18 almost exactly replicates the underlying structures of stop layer 14, creating a series of peaks and valleys so that the exposed surface of the substrate is non-planar.

As discussed above, one purpose of planarization is to polish filler layer 18 until the top surface of stop layer 14 is entirely exposed. The resulting substrate surface is substantially planar, as the trenches and holes in the stop layer have been filled with the filler layer and the excess filler layer has been polished away. If the filler layer is conductive and the stop layer is insulative, then this polishing will leave conductive vias between insulative islands, and conductive plugs in any holes in the insulative layer (see FIG. 3E).

As previously discussed, one problem with CMP is the dishing effect. Without being limited to any particular theory, one possible cause of the dishing effect is the use of high selectivity slurries during overpolishing. Specifically, due to non-uniformities in the polishing process, the filler layer may not be removed uniformly across the substrate. Consequently, it may be necessary to "overpolish" the substrate with a high-selectivity slurry to ensure that the upper surface of the stop layer is exposed across the entire face of the substrate. Overpolishing with the high-selectivity slurry removes the excess filler layer and avoids nonuniform polishing of the stop layer, thereby improving global flatness. However, since the high-selectivity slurry polishes the filler layer but not the stop layer, this overpolishing tends to polish away a portion of the filler layer in the trenches or holes, thereby causing dishing.

Referring to FIG. 3B, substrate 10 is initially polished at polishing stations 25a and 25b with a "high-selectivity" slurry and one or more hard, rough polishing pads 100. The selectivity of the slurry refers to the ratio of the polishing rate of the filler layer to the polishing rate of the stop layer. The high-selectivity slurry may have a selectivity on the order of 20:1 to 300:1. Preferably, the high-selectivity slurry has a selectivity greater than about 20:1, e.g., a selectivity of approximately 100:1. The substrate is polished with the high-selectivity slurry until an endpoint detector, e.g., laser interferometer 90, detects that the stop layer 14 has been exposed. At this point, as shown in FIG. 3C, the stop layer should be at least partially exposed. Specifically, due to nonuniformities in the polishing rate across the substrate, a thin film 19 of the filler layer will probably remain over some portions of the stop layer, whereas other portions of the stop layer will be exposed.

After the endpoint detector determines that the stop layer has been at least partially exposed, the substrate is subjected to an "overpolish" step to ensure that substantially all of the top surface of the stop layer is, in fact, exposed. About half of the stop layer may be exposed when the substrate is subjected to the overpolish step. Referring to FIG. 3D, the substrate is polished at final polishing station 25c using a "non-selective" or "low-selectivity" polishing slurry on polishing pad 110. The low-selectivity slurry should have a selectivity on the order of 1:1 to 6:1. Preferably, the second slurry has a selectivity less than about 6:1, e.g., approximately 1:1. The substrate is polished with polishing pad 110 until stop layer 14 is substantially entirely exposed and thin film layer 19 has been substantially elimiated, as shown in FIG. 3E.

The use of a low-selectivity slurry in the overpolishing step ensures that both the filler layer and the stop layer are polished, thereby reducing or eliminating dishing. In addition, the majority of the filler layer is planarized quickly by use of the high-selectivity slurry and hard polishing pads, thereby providing high throughput and ensuring global planarity. Furthermore, since dishing is reduced, a thinner filler layer can be used, thereby decreasing the polishing time and increasing the throughput of the CMP apparatus.

Variations of the process are possible. For example, the substrate could be polished until stop layer 14 is exposed at polishing station 25a. The overpolishing step may be performed, e.g., at second polishing station 25b, with a hard polishing pad, rather than a soft polishing pad. Both the primary polishing step and the overpolishing step can be performed on at single polishing station, e.g., polishing station 25a. The overpolishing step may be followed by a buffing step with the low-selectivity slurry at the same polishing station (particularly if a soft polishing pad was used in overpolishing step) or at a different polishing station (particularly if a hard polishing pad was used in the overpolishing step).

Alternately, polishing with the high-selectivity slurry could continue after the endpoint is detected, e.g., at the second polishing station 25b, to provide overpolishing, and then the substrate could be buffed and/or subjected to an additional polishing step with the low-selectivity slurry, e.g., at polishing station 25c. In this case, the buffing or additional polishing step with the low-selectivity slurry polishes both the filler layer and the stop layer to reduce or eliminate dishing created in the overpolishing step.

The polishing process is usable with a variety of filler layers and stop layers, and can be adapted for a variety of fabrication steps that use CMP to planarize and expose a stop layer.

For example, the polishing process may be used in silicon polishing. In this case, the stop layer is typically an insulative oxide, such as silicon oxide, and the filler layer is a silicon layer, such as polycrystaline silicon (polysilicon), amorphous silicon or single crystal silicon. If silicon polishing is conducted, then an initial native oxide removal step may be performed, as discussed in U.S. application Ser. No. 09/097,004, entitled A TECHNIQUE FOR CHEMICAL MECHANICAL POLISHING SILICON, by Shijian Li et al., filed Jun. 13, 1998, assigned to the assignee of the present invention, the entire disclosure of which is incorporated herein by reference.

Assuming that the filler layer is polysilicon and the stop layer is silicon oxide, the high-selectivity slurry should be a polysilicon slurry, and the low-selectivity slurry should be an oxide polishing slurry. The polysilicon-polishing slurry may include deionized water, fumed silica abrasive particles, and an amine-based chemically reactive agent which may also adjust the pH of the slurry. Suitable polysilicon-polishing slurries include EPP-1000, EPP-1060, and EPP-1000LRP, available from Cabot Corp.; Planarlite-6101, Planarlite-6102 and Planarlite-6203, available from Fujimi, of Wilsonville, Oreg., and SDE-3000 available from Rodel, Inc. The polysilicon-polishing slurries mentioned above from Cabot, Fujimi and Rodel have selectivities of about 1:100 to 1:1000, depending on the composition of the insulative layer. The low-selectivity slurry may include deionized water, fumed silica abrasive particles, and a reactive agent pH adjuster, such as potassium hydroxide (KOH) or ammonium hydroxide. A suitable low-selectivity silicon/polysilicon polishing slurry is is Advansil 2000, available from Rodel.

The polishing process may also be used for polishing of a conductive layer. In this case, the stop layer is typically an insulative layer, such as an oxide, e.g., silicon oxide, and the filler layer is conductive layer, such as a metal, e.g., aluminum, copper or tungsten. For metal polishing, the high-selectivity slurry may be SSW-2000, available from Cabot, and the low-selectivity slurry may be SS-12, availabled from Cabot.

In addition, the polishing process may be used for shallow trench isolation (STI). In STI polishing, the stop layer is a first dielectric material, such a nitride, e.g., silicon nitride, and the filler layer is a second dielectric material, such as an oxide, e.g., silicon oxide. For STI polishing, the high-selectivity slurry may be Corundum, available from Rodel, whereas the low-selectivity slurry may be SS-12, also available from Rodel.

Referring to FIG. 4A, an optional barrier layer 16 may be disposed between filler layer 18 and stop layer 14. For example, if the stop layer is an oxide and the filler layer is tungsten, then the barrier layer may include a lower layer (nearest the substrate) of titanium and an upper layer of titanium nitride. Referring to FIG. 4B, substrate 10 is initially polished with a high-selectivity slurry. As best shown in FIG. 4C, when the endpoint detector determines that the stop layer is exposed, a thin film 19' of barrier material may remain over the stop layer. Referring to FIG. 4D, the substrate is subjected to an overpolishing, final polishing, or buffing step at final polishing station 25c using a low-selectivity polishing slurry. As shown in FIG. 4E, overpolishing with a low-selectivity slurry will remove the thin film of barrier material to completely expose the top surface of the stop layer without causing dishing.

The invention is not limited to the embodiment depicted and described. Rather, the scope of the invention is defined by the appended claims.

What is claimed is:

1. A method of chemical mechanical polishing a substrate having a filler layer disposed on a stop layer, comprising:
    chemical mechanical polishing the filler layer of the substrate with a first slurry until the stop layer is partially covered by the filler layer and partially exposed; and
    chemical mechanical polishing the substrate with a second slurry which has a lower selectivity than the first slurry until the stop layer is substantially completely exposed.

2. The method of claim 1, wherein the first slurry has a selectivity greater than about 20:1.

3. The method of claim 2, wherein the first slurry has a selectivity of approximately 100:1.

4. The method of claim 1, wherein the second slurry has a selectivity less than about 6:1.

5. The method of claim 4, wherein the second slurry has a selectivity of approximately 1:1.

6. The method of claim 1, wherein the stop layer is a first dielectric material and the filler layer is a second dielectric material.

7. The method of claim 6, wherein the first dielectric material is a nitride and the second dielectric material is an oxide.

8. The method of claim 1, wherein the stop layer is insulative and the filler layer is conductive.

9. The method of claim 8, wherein the stop layer is an oxide and the filler layer is a metal.

10. The method of claim 1, wherein the filler layer is a silicon layer and the stop layer is an insulative layer.

11. The method of claim 10, wherein the silicon layer is selected from the group consisting of polycrystalline silicon, amorphous silicon, and single crystal silicon.

12. The method of claim 1, wherein the second polishing step comprises overpolishing the substrate.

13. The method of claim 1, wherein the second polishing step comprises buffing the substrate.

14. The method of claim 1, wherein the first polishing step comprises polishing with a first polishing pad, and the second polishing step comprises polishing with a second polishing pad that is softer than the first polishing pad.

15. The method of claim 1, wherein the first polishing step comprises polishing at a plurality of polishing stations.

16. The method of claim 1, wherein the second polishing step comprises polishing at a single polishing station.

17. The method of claim 1, wherein the first and second polishing steps occur at the same polishing station.

18. A method of chemical mechanical polishing a substrate having a filler layer disposed on a stop layer, wherein a barrier layer is disposed between the filler layer and the stop layer, the method comprising:
    chemical mechanical polishing the filler layer of the substrate with a first slurry until the stop layer is partially covered by the barrier layer and is partially exposed; and
    chemical mechanical polishing the substrate with a second slurry which has a lower selectivity than the first slurry until the stop layer is substantially completely exposed.

19. The method of claim 18, wherein the second polishing step comprises removing at least a portion of the barrier layer to ensure that the stop layer is substantially exposed.

20. A method of chemical mechanical polishing a substrate having a filler layer disposed on a stop layer, comprising:
    chemical mechanical polishing the substrate with a first slurry until an endpoint detector determines that the stop layer is partially covered by the filler layer and partially exposed; and
    chemical mechanical polishing the filler layer of the substrate with a second slurry which has a lower selectivity than the first slurry to ensure that the stop layer is substantially completely exposed.

21. A method of filling a trench in a stop layer on a substrate, comprising:
    depositing a filler layer over the stop layer;
    chemical mechanical polishing the filler layer of the substrate with a first polishing pad and a first slurry until the stop layer is partially covered by the filler layer and partially exposed; and
    chemical mechanical polishing the filler layer of the substrate with a second polishing pad and a second slurry which has a lower selectivity than the first slurry until a top surface of the stop layer is substantially completely exposed.

22. A method of filling a trench in a layer on a substrate, comprising:
    depositing a filler material over a patterned layer having a top surface and a trench so that the trench is filled with the filler material and the filler material covers the top surface of the layer;
    chemical mechanical polishing the substrate with a first slurry until the top surface of the layer is partially covered by the filler layer and partially exposed; and
    chemical mechanical polishing the substrate with a second slurry which has a lower selectivity than the first slurry until the top surface of the layer is substantially completely exposed leaving the trench filled with the filler material.

* * * * *